United States Patent
Hamajima

[19]

[11] Patent Number: 6,013,954
[45] Date of Patent: Jan. 11, 2000

[54] SEMICONDUCTOR WAFER HAVING DISTORTION-FREE ALIGNMENT REGIONS

[75] Inventor: Tomohiro Hamajima, Tokyo, Japan

[73] Assignee: NEC Corporation, Tokyo, Japan

[21] Appl. No.: 08/828,669

[22] Filed: Mar. 31, 1997

[51] Int. Cl.$^7$ .................................................. H01L 23/544
[52] U.S. Cl. ........................ 257/797; 257/350; 257/351; 257/353; 257/370; 257/347
[58] Field of Search ..................... 257/350, 351, 257/370, 353, 374, 413, 344, 347, 408, 797

[56] References Cited

U.S. PATENT DOCUMENTS

| | | | |
|---|---|---|---|
| 5,294,823 | 3/1994 | Eklund et al. ........................... | 257/353 |
| 5,315,144 | 5/1994 | Cherne ..................................... | 257/351 |

FOREIGN PATENT DOCUMENTS 2-312220  12/1990  Japan .

*Primary Examiner*—Carl W. Whitehead, Jr.
*Attorney, Agent, or Firm*—Foley & Lardner

[57] ABSTRACT

A semiconductor wafer having an SOI (Silicon-On-Insulator) structure and capable of being accurately aligned without undesirable contrast appearing in an infrared transmission image. The wafer is implemented as a laminate SOI wafer including an SOI layer. An aligning oxide film pattern and an oxide film pattern are buried in the SOI layer. The aligning oxide film pattern and oxide film pattern are respectively aligned with an aligning mask pattern and a mask pattern provided on a masking quartz wafer. In this condition, the laminate wafer is subjected to preselected processing. One of opposite major surfaces of the SOI wafer facing the quartz wafer is smoothed over its regions containing at least the aligning oxide film pattern and through which infrared rays are to be transmitted with respect to photoresist. The other major surface is smoothed over the above regions by having a polycrystal silicon film thereof removed.

6 Claims, 5 Drawing Sheets

SEMICONDUCTOR WAFER HAVING DISTORTION-FREE ALIGNMENT REGIONS

BACKGROUND OF THE INVENTION

The present invention relates to a semiconductor wafer having an accurately aligned SOI (Silicon-On-Insulator) structure, and a method of producing the same.

Today, to meet the increasing demand for fine and dense semiconductor IC (Integrated Circuit) configurations, a laminate integration of devices, wirings and so forth is under study. An SOI structure is attracting increasing attention as one of laminate integration technologies relating to semiconductor wafers. In the SOI structure, a layer of silicon oxide or similar dielectric substance is implemented as a buried layer, and a thin film of single-crystal silicon is formed on the buried layer. The prerequisite with the SOI structure is that an SOI layer be aligned with the buried layer at the time of the first patterning of the SOI layer. This is particularly true when a pattern corresponding to devices is provided on the surface of the SOI layer. However, the problem is that the buried layer underlies the SOI layer and cannot be observed with visible rays. Means for observing the buried structure has been proposed in various forms in the past. Japanese Patent Laid-Open Publication No. 2-312220, for example, teaches an aligning device using a transmission image formed by infrared rays. This aligning device aligns a plurality of wafers formed with two or more device layers.

However, the above aligning device has a problem that undesirable contrast occurs in addition to the infrared transmission image representative of the buried layer. The undesirable contract is superimposed on the desired image and prevents the pattern of the aligning oxide film from being clearly observed. This lowers the alignment accuracy and brings about defective characteristic due to misalignment.

SUMMARY OF THE INVENTION

It is therefore an object of the present invention to provide a semiconductor wafer capable of being accurately aligned without undesirable contrast appearing in an infrared transmission image.

In accordance with the present invention, in a laminate semiconductor wafer having an aligning oxide film pattern and an oxide film pattern buried in one of opposite major surfaces thereof to be respectively aligned with an aligning mask pattern and a mask pattern drawn on a masking wafer, the other major surface of the laminate semiconductor wafer is smoothed over regions containing at least the aligning oxide film pattern and through which infrared rays are to be transmitted.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
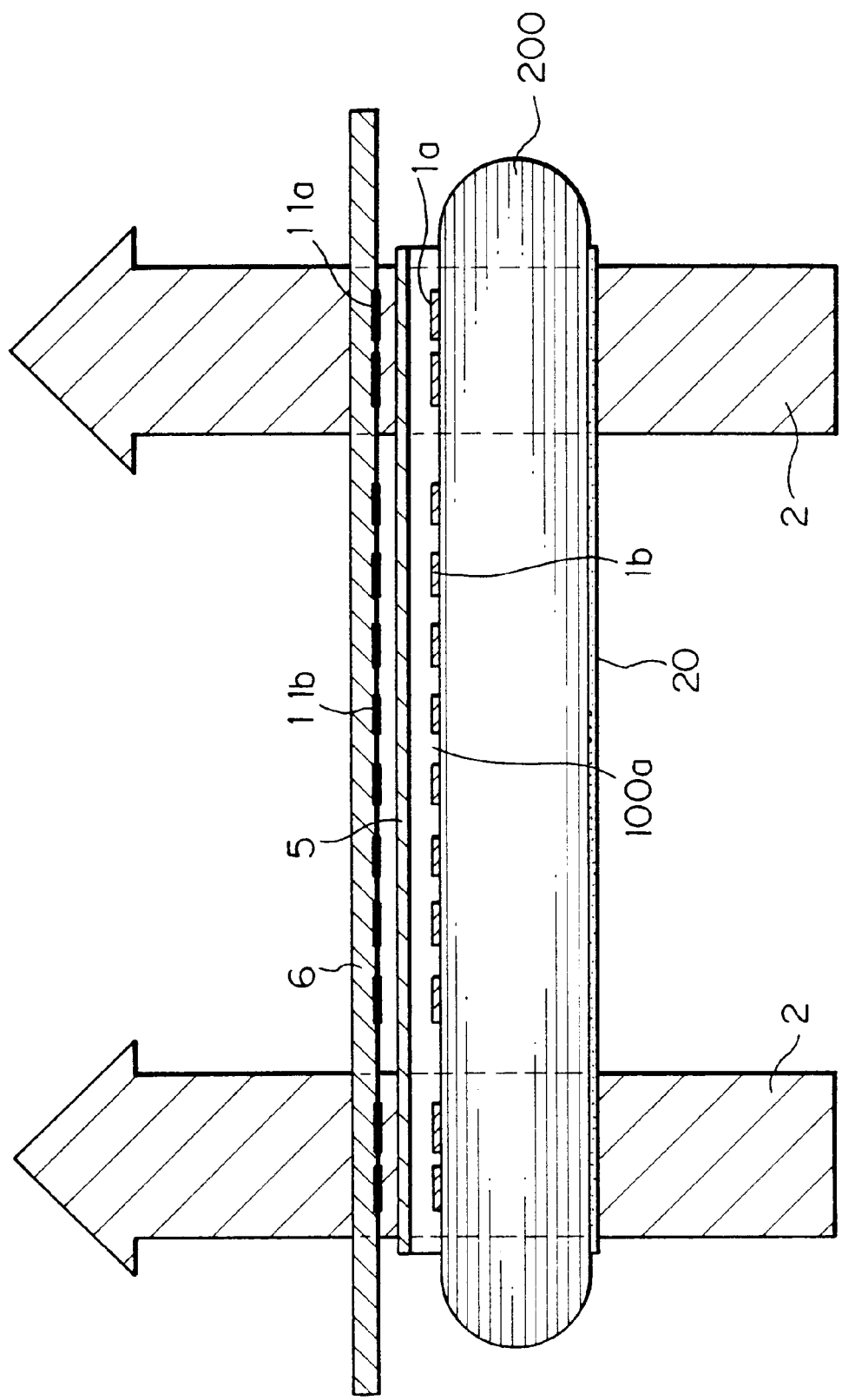
FIG. 1 is a sectional side elevation showing a semiconductor wafer for describing how a conventional aligning device aligns a buried oxide film pattern and a mask pattern.

To better understand the present invention, a brief reference will be made to a conventional semiconductor wafer, shown in FIG. 1. Briefly, the wafer is made up of a plurality of wafers having two or more device layers and aligned by a method using an infrared transmission image. Specifically, FIG. 1 shows an SOI wafer subjected to the initial aligning step. A wafer chuck and other conventional arrangements are not shown in FIG. 1.

As shown in FIG. 1., the SOI wafer includes an SOI layer 100a produced by polishing and patterning a first single-crystal silicon wafer having an insulation film thereon. The SOI layer 100a and a second single-crystal silicon wafer 200 are adhered together. An oxide film pattern 1b for the insulation between devices and an oxide film 1a for alignment are formed on the surface of the SOI layer 100 adhered to the silicon wafer 200. Photoresist 5 is applied to the other surface of the SOI layer 100. A polycrystal silicon film 20 is formed on the surface of the silicon wafer 200 opposite to the surface adhered to the SOI layer 100a. A quartz wafer 6 is positioned above the SOI layer 100 and formed with an aligning mask pattern 11a and a mask pattern 11b. To form a laminate semiconductor wafer, the SOI wafer is subjected to preselected processing using the quartz wafer 6.

The quartz wafer 6 and SOI wafer are individually movable in the horizontal direction. A light source, not shown, for emitting infrared rays 2 is located below the SOI wafer. For alignment, two infrared microscopes are used to observe an image formed by the infrared rays 2 transmitted through the oxide film pattern 1a, and the mask pattern 11a.

In the above configuration, the polycrystal silicon film 20 is formed on the surface of the SOI wafer where no devices will be provided, i.e., the rear of the SOI wafer. Such an EG (Extrinsic Gettering) film is used to, e.g., capture heavy metals and other contaminants during device process. The polycrystal silicon film 20 is sometimes replaced with, e.g., an oxide film for correcting the deformation of the SOI wafer. Further, the above thin film is sometimes not formed in order to roughen the rear of the SOI wafer intentionally by, e.g., etching or sand-blasting; etching forms undulation while sand-blasting introduces a distortion layer.

The conventional semiconductor wafer described above has the following problem left unsolved. The oxide film pattern buried in the SOI wafer for alignment is observed in the form of an image with contrast formed by the infrared rays transmitted through the SOI wafer. However, undesirable contrast ascribable to the above-mentioned polycrystal silicon layer formed on the rear of the wafer, undulation or distortion layer appears in the visual field of the or to the infrared microscope in addition to the infrared transmission image representative of the oxide film pattern. In the case of the polycrystal silicon film, the undesirable contrast is noticeably effected by, e.g., the captured contaminants. The undesirable contract is superimposed on the desired image and prevents the pattern of the oxide film from being clearly observed. This lowers the alignment accuracy and brings about defective characteristic due to misalignment.

Figure 2:
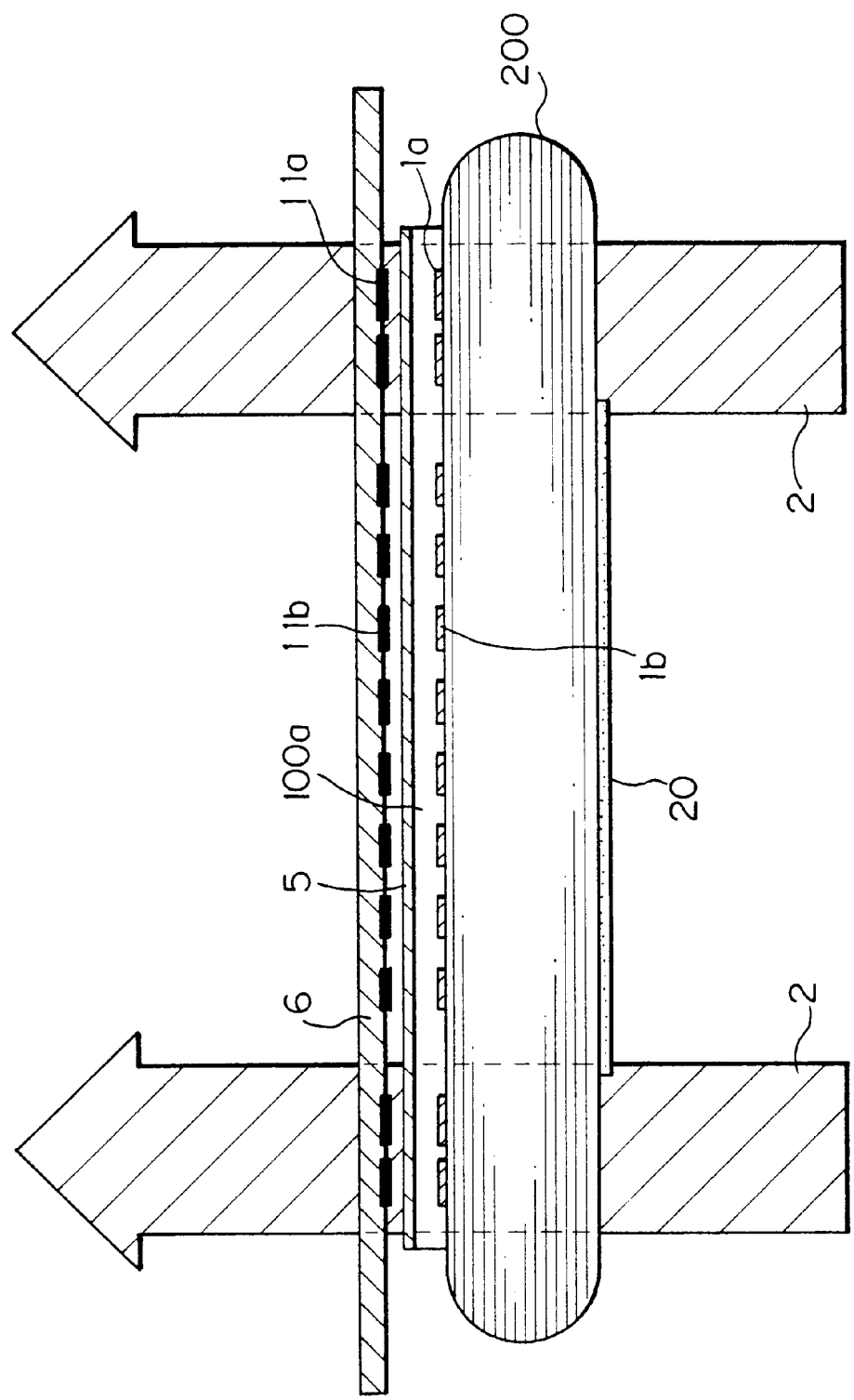
FIG. 2 is a view similar to FIG. 2, showing how a first embodiment of the present invention aligns a buried oxide film pattern and a mask pattern.

Referring to FIG. 2, a semiconductor wafer embodying the present invention will be outlined first. As shown, the wafer, like the conventional wafer shown in FIG. 1, has an aligning oxide film pattern 1a and an oxide film pattern 1b buried in an SOI layer 100a included in a laminate SOI wafer.

The oxide film patterns 1a and 1b are respectively aligned with aligning mask pattern 11a and a mask pattern 11b provided on a quartz or masking wafer 6.

The SOI wafer of the illustrative embodiment has an improved structure, as follows. One of opposite major surfaces of the SOI wafer to be aligned with the quartz wafer 6 is smoothed over its region including at least the oxide film pattern 1a for alignment and through which infrared rays 2 are to be transmitted with respect to photoresist 5. The other major surface is smoothed over its region containing at least the oxide film pattern 1a and through which the infrared rays 2 are to be transmitted. This is done by removing a polycrystal silicon film 20. The SOI layer 100a is formed by polishing and patterning a first polycrystal silicon wafer carrying an insulation film thereon, as in the conventional structure. The SOI layer 100a and a second single-crystal silicon wafer 200 are adhered together. The oxide film pattern 1b for the isolation of devices and the oxide film pattern 1a for alignment are formed on the front of the SOI layer 100a adhered to the silicon wafer 200, constituting an SOI structure.

The SOI wafer has its region for transmitting the infrared rays 2 smoothed on both major surfaces thereof, as stated above. Therefore, an image formed by the transmitted infrared rays 2 is free from undesirable contrast only if alignment is effected on the basis of the image representative of the oxide film pattern 1a. It follows that the oxide film pattern 1b can be grasped observed in the form of an infrared transmission image and can be accurately aligned with the mask pattern 11b. Consequently, the oxide film pattern 1b and mask pattern 11b are brought into accurate alignment, implementing a laminate semiconductor wafer having a desirable characteristic.

While the SOI wafer of the embodiment has its both major surfaces smoothed over the infrared ray transmitting region, only one of the major surfaces may be smoothed over its entire area.

A specific procedure for producing the above laminate SOI wafer and a semiconductor wafer using the same will be described hereinafter. To produce the SOI wafer, an insulation film pattern is locally formed on one major surface of a first single-crystal silicon wafer (film forming step). After the insulation film pattern has been removed, an oxide film is buried in the portion having been occupied by the insulation film pattern so as to form an oxide film pattern and an aligning oxide film pattern (patterning step). One major surface of a second single-crystal silicon wafer is caused to face the surface of the first silicone wafer undergone the patterning step, and then adhered to the above surface (adhering step). As a result, a laminate single-crystal silicon wafer is formed. Subsequently, the laminate silicon wafer is heated so as to have its adhesive strength increased (heating step). The first single-crystal silicon wafer included in the laminate structure has is surface ground in order to form an active layer having a preselected thickness (first grinding step). Finally, the second single-crystal silicon wafer also included in the laminate structure has its surface ground and then polished to be smooth (second grinding step).

The first grinding step is effected such that the front of the first silicon wafer is smoothed over its infrared ray transmitting region containing at least the aligning oxide film pattern. Likewise, the second grinding step is effected such that the front of the second silicon wafer is smoothed over its infrared ray transmitting region containing at least the aligning oxide film pattern.

To produce a semiconductor wafer, the conventional aligner is usable. Specifically, the quartz wafer 6 with the mask patterns 11a and 11b is positioned such that an image formed by the infrared rays transmitted through the oxide film pattern 1a coincides with the mask pattern 11a for alignment. This is followed by preselected processing.

Preferred embodiments of the semiconductor wafer and method of producing the same in accordance with the present invention are as follows.

1st Embodiment

The SOI wafer and quartz wafer 6 shown in FIG. 2 were produced. In the SOI wafer, the SOI layer 100a based on the first silicon wafer and the second silicon wafer 200 are adhered in an SOI configuration. The aligning oxide film patten 1a and oxide film pattern 1b are locally formed at the interface between the two silicon wafers. The aligning pattern 1a is located in the peripheral portion of the above interface while the pattern 1b is provided with any desired configuration. The pattern 1b is used to isolate or insulate devices to be formed on the surface of the SOI layer 100a. While the pattern 1a is as fine as the pattern 1b available with conventional photolithography, it is shown in a slightly larger scale for clarity.

Figure 3:
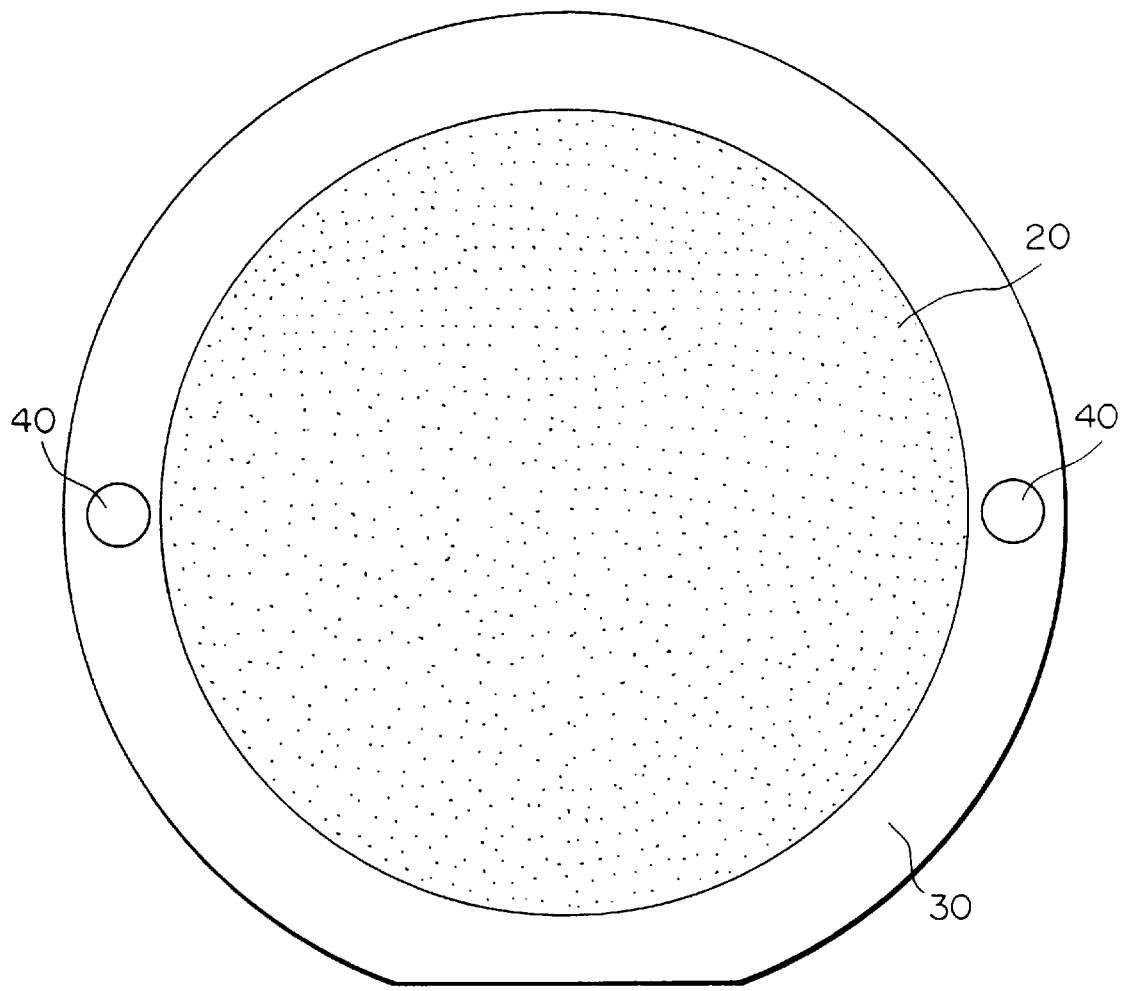
FIG. 3 is a plan view showing the rear of an SOI wafer included in a semiconductor wafer shown in FIG. 2.

FIG. 3 shows the rear of the SOI wafer. As shown, the SOI wafer has the polycrystal silicon film 20 for EG at its center. The peripheral portion of the wafer including aligning areas regions 40 is implemented as a smoothed surface 30.

How the aligning pattern 1a of the SOI wafer and the aligning mask pattern 11a of the quartz wafer 6 are aligned will be described. It is to be noted that the photoresist 5 applied to the surface of the SOI layer 100a and the quartz wafer 6 are used for photolithography.

The infrared rays 2 whose wavelength is about 1.2 $\mu$m are emitted toward the smoothed aligning regions 40 of the rear of the SOI wafer. An image formed by the rays 2 transmitted through the oxide film pattern 1a is observed through an infrared microscope. The mask pattern 11a formed in the peripheral portion of the quartz wafer 6 is brought into the same visual field as the above image in order to effect alignment.

Because the rear of the SOI wafer has its regions 30 smoothed, it obviates the undesirable contrast described in relation to the conventional structure. Therefore, only the image representative of the aligning pattern can be seen in the visual field of the infrared microscope, insuring accurate alignment. Alignment effected with the SOI wafer and quartz wafer 6 implemented accuracy as high as about ±1 $\mu$m. Even an SOI wafer provided with undulation on its rear by etching was aligned with accuracy of about +3 $\mu$m. In this manner, the illustrative embodiment can enhance accurate alignment to a noticeable degree.

After the above procedure, the photoresist 5 on the front of the SOI layer 100a is exposed by, e.g., ultraviolet rays whose wavelength is 400 nm. As a result, the mask pattern 11b is transferred to the photoresist 5, completing a semiconductor wafer. For the aligning procedure, use may be made of a conventional aligner.

Figure 4A:
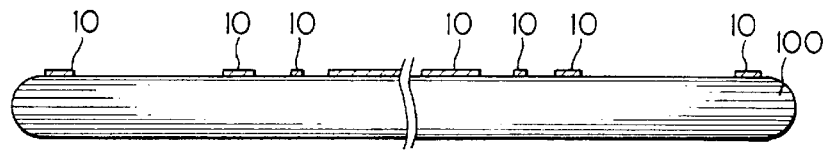
FIGS. 4A–4F demonstrate a sequence of steps for producing the SOI wafer shown in FIG. 3.

A method of producing the SOI wafer will be described more specifically with reference to FIGS. 4A–4F. First, a first single-crystal silicon wafer 100 having a diameter of 5 inches and a (100) orientation and a second single-crystal silicon wafer 200 are prepared. As shown in FIG. 4A, a silicon oxide film 10 is formed on the front of the first silicon wafer 100 by, e.g., thermal oxidation (film forming step). Then, the silicon oxide film 10 is locally removed by photolithography and dry etching so as to form apertures. As a result, single-crystal silicon appears through the apertures.

Figure 4B:
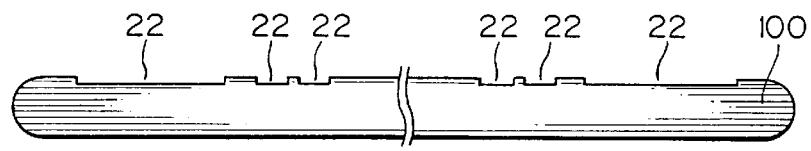
Figure 4C:
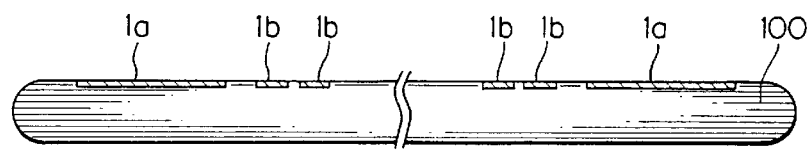

The single-crystal silicon is etched by, e.g., dry etching with the locally removed silicon oxide film 10 serving as a mask, as shown in FIG. 4B (former half of the patterning step). As a result, about 1 $\mu$m deep recesses 22 are formed in the wafer 100. After the silicon oxide film or mask 10 has been removed, an oxide film having a uniform thickness capable of filling the recesses 22 is formed on the wafer 100 by thermal oxidation, low temperature CVD (Chemical Vapor Deposition) or similar technology. Then, the wafer 100 is ground and polished only to such a degree that the oxide film remains in the recesses 22. Subsequently, the aligning oxide film pattern 1a and oxide film pattern 1b are formed, as shown in FIG. 4C (latter half of the patterning step). In this manner, the two oxide film patterns 1a and 1b are formed at the same time via a single mask pattern.

If desired, the oxide film patterns 1a and 1b may be implemented as LOCOS (Local Oxidation of Silicon) oxide films.

Figure 4D:
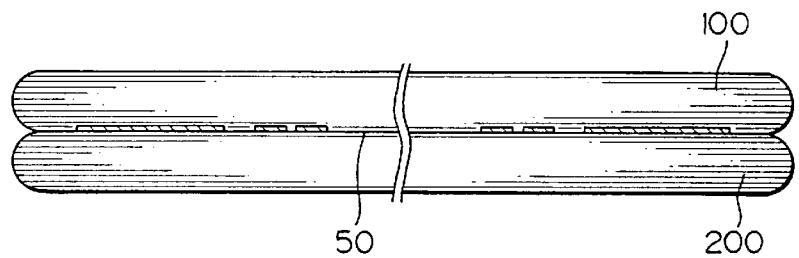

As shown in FIG. 4D, the wafer 100 is adhered to the second silicon wafer 200 at its surface carrying the oxide film patterns 1a and 1b (adhering step). Consequently, a laminate single-crystal silicon wafer including an interface 50 is produced. Subsequently, the laminate wafer is heated at 1,100° C. to 1,200° C. for 2 hours in an oxidizing atmosphere in order to increase the adhesive strength (heating step).

Figure 4E:
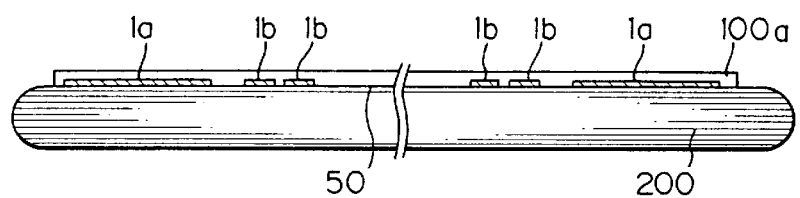

As shown in FIG. 4E, the front of the first silicon wafer 100 included in the above laminate structure is ground and polished in order to reduce the thickness of the laminate (first grinding step). As a result, the SOI layer or active layer 100a having a thickness of about 10 μm is formed. In addition, the polycrystal silicon layer 20 having a thickness of about 1 μm is formed on the rear of the laminate wafer by CVD.

Figure 4F:
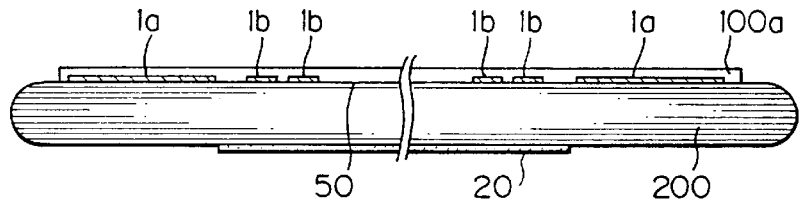

Finally, as shown in FIG. 4F, the rear of the laminate wafer, i.e., the front of the second silicon wafer 200 has its peripheral portion containing the infrared red transmitting regions locally polished in order to remove the silicon layer 20 (second polishing step). Consequently, the smoothed surface 30, FIG. 3, including the aligning regions 40 is formed, completing an SOI wafer.

2nd Embodiment

Figure 5:
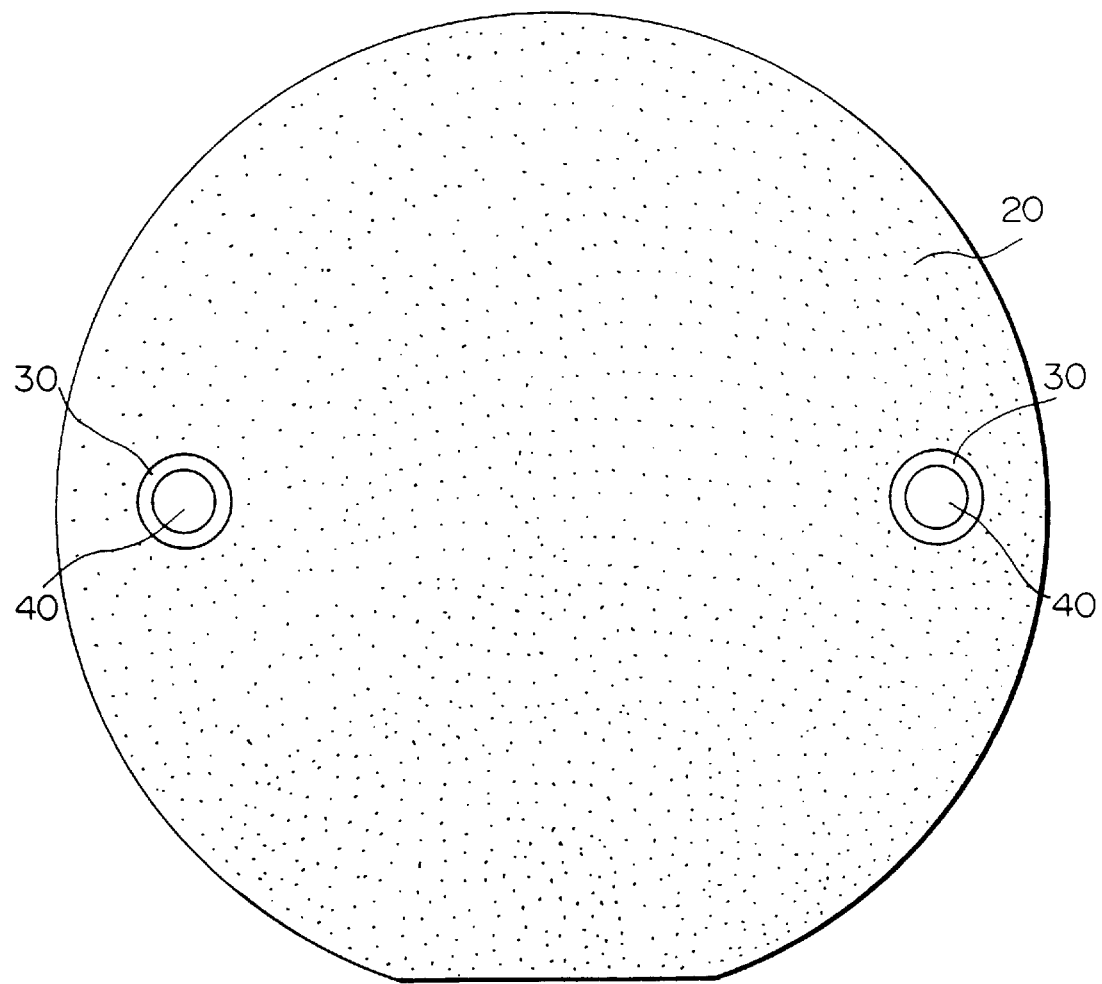
FIG. 5 is a plan view showing the rear of another SOI wafer included in a second embodiment of the present invention.

FIG. 5 is a view similar to FIG. 3, but showing the rear of another SOI wafer. As shown, the polycrystal silicon film 20 is formed on the entire rear area except for the smoothed surfaces 30 (having a diameter of several millimeters each) including the aligning regions 40. In this manner, the silicon film 20 may be partly removed in order to expose the smoothed surfaces 30 to the outside. This kind of SOI wafer can also be formed by the procedure described in relation to the first embodiment.

In summary, it will be seen that the present invention provides a semiconductor wafer having its surface to be radiated by infrared rays smoothed, and thereby freeing an infrared transmission image from undesirable contrast. This allows an oxide film pattern formed on the wafer for alignment to be accurately aligned with a mask pattern formed on a masking wafer, providing the wafer with a desirable characteristic.

Various modifications will become possible for those skilled in the art after receiving the teachings of the present disclosure without departing from the scope thereof. For example, while the smoothed surfaces 30 have been shown and described on the assumption that the polycrystal silicon film 20 is formed on the rear of the SOI wafer, the rear of the SOI wafer may be entirely polished if a thin film does not have to be formed on the rear. The present invention is applicable even to an adhered SOI wafer with a local buried oxide film and adapted for an IPD (Intelligent Power Device), e.g., a combination of a vertical power MOS-FET or similar high voltage power device and a CMOS LSI, bipolar IC or similar low voltage device. The present invention is practicable not only with the adhered SOI wafer, but also with any other laminate semiconductor wafer which is aligned by use of a transmission image. In addition, the present invention is applicable even to the alignment of laminate wafers having tridimensional ICs or similar devices in a buried configuration.

What is claimed is:

1. A semiconductor comprising:

a semiconductor laminated unitary wafer including an oxide film pattern and an alignment pattern;

a first surface of said laminated unitary wafer being smooth over portions thereof at least overlying said alignment pattern, and a second surface, opposite to and underlying said first surface, said second surface being smooth over portions thereof at least underlying said alignment pattern, wherein, alignment radiation passing through said alignment pattern and regions of said first and second surfaces aligned with said alignment pattern is not disturbed by rough surface regions including oxide surface regions.

2. A semiconductor as recited in claim 1, wherein said semiconductor laminated unitary wafer comprises:

a first single-crystal silicon wafer having a first surface defining the first surface of said laminated unitary wafer and a second surface, said oxide film pattern and said alignment pattern on said second surface of said first single-crystal silicon wafer, and a second single-crystal silicon wafer having a first surface positioned adjacent to and underlying said second surface of said first single-crystal silicon wafer and a second surface of said second single-crystal silicon wafer defining said second surface of said laminated unitary wafer.

3. A semiconductor as recited in claim 2, wherein said second surface of said laminated unitary wafer contains an oxide layer except in the region of said smooth portions.

4. A semiconductor as recited claim 2, wherein said alignment pattern is positioned on a peripheral region of said laminated unitary wafer and said second surface of said laminated unitary wafer contains an oxide layer except in said peripheral region.

5. A laminate semiconductor wafer comprising:

a first semiconductor having a first surface and having a patterned region and an alignment region on a second surface, opposite said first surface, regions of said first surface overlying said alignment region being distortion-free with respect to alignment radiation, a second semiconductor having a first surface laminated to and underlying said second surface of said first semiconductor and a second surface, at least portions of said second surface of said second semiconductor being aligned with and underlying said alignment region and being distortion-free with respect to alignment radiation.

6. A laminate semiconductor wafer as recited in claim 5, wherein said first semiconductor comprises a first single-crystal silicon wafer and said second semiconductor comprises a second single-crystal silicon wafer and said alignment radiation comprises infrared radiation.

* * * * *